United States Patent
Huang et al.

(10) Patent No.: US 8,748,913 B2
(45) Date of Patent: Jun. 10, 2014

(54) LIGHT EMITTING DIODE MODULE

(75) Inventors: Shih-Cheng Huang, Hsinchu (TW); Po-Min Tu, Hsinchu (TW)

(73) Assignee: Advanced Optoelectronics Technology, Inc., Hsinchu Hsien (TW)

(*) Notice: Subject to any disclaimer, the term of this patent is extended or adjusted under 35 U.S.C. 154(b) by 76 days.

(21) Appl. No.: 13/305,757

(22) Filed: Nov. 29, 2011

(65) Prior Publication Data

US 2012/0175646 A1  Jul. 12, 2012

(30) Foreign Application Priority Data

Jan. 10, 2011  (CN) .......................... 2011 1 0003606

(51) Int. Cl.
*H01L 33/00* (2010.01)

(52) U.S. Cl.
USPC ................. 257/88; 257/98; 257/99; 257/100; 257/E33.028; 438/122

(58) Field of Classification Search
USPC ............... 257/88, E33.028, 98–100; 438/122
See application file for complete search history.

(56) References Cited

U.S. PATENT DOCUMENTS

| | | | |
|---|---|---|---|
| 6,657,237 B2 | 12/2003 | Kwak et al. | |
| 2006/0197102 A1* | 9/2006 | Ogihara et al. | 257/99 |
| 2007/0181895 A1 | 8/2007 | Nagai | |
| 2008/0029761 A1* | 2/2008 | Peng | 257/43 |
| 2010/0276722 A1 | 11/2010 | Baur et al. | |
| 2012/0175628 A1* | 7/2012 | Huang et al. | 257/76 |
| 2013/0113012 A1* | 5/2013 | Shinohara et al. | 257/98 |

FOREIGN PATENT DOCUMENTS

| | | |
|---|---|---|
| CN | 1367540 A | 9/2002 |
| CN | 101586791 A | 11/2009 |
| TW | 200537715 A | 11/2005 |
| TW | 200539307 A | 12/2005 |
| TW | 200919789 A | 5/2009 |
| WO | 2009097722 A1 | 8/2009 |

* cited by examiner

*Primary Examiner* — Elias M Ullah
(74) *Attorney, Agent, or Firm* — Novak Druce Connolly Bove + Quigg LLP

(57) ABSTRACT

An LED module includes a base, a circuit layer formed on the base and multiple LEDs each having an LED die connecting to the circuit layer. The circuit layer includes multiple connecting sections. Each connecting section includes a first connecting part and a second connecting part electrically insulating and spaced from each other. Each LED includes an electrode layer having a first section and a second section electrically insulated from the first section and respectively electrically connecting the first and second connecting parts of a corresponding connecting section. The LED die is electrically connected to the second section. A transparent electrically conductive layer is formed on the LED die and electrically connects the LED die to the first section of the electrode layer. An electrically insulating layer is located between the LED die and surrounding the LED die except where the transparent electrically conductive layer connects.

17 Claims, 5 Drawing Sheets

LIGHT EMITTING DIODE MODULE

BACKGROUND

1. Technical Field

The present disclosure relates to solid state light emitting devices and, more particularly, to a light emitting diode (LED) module.

2. Description of Related Art

In recent years, LEDs have been widely used to provide illumination. Typically, an LED may include an LED die, an electrode layer, and two gold wires. The LED die may include a light emitting surface. Two spaced terminals may be formed on the light emitting surface. The LED die may be electrically connected to the electrode layer through wire bonding, in which the two gold wires may be respectively soldered to the terminals and the electrode layer by solder. However, part of the light emitting surface of the LED die may be blocked by the solder and the gold wires, resulting in a decreased illumination efficiency of the LED.

What is needed, therefore, is an LED to overcome the described disadvantages.

DETAILED DESCRIPTION

Figure 1:
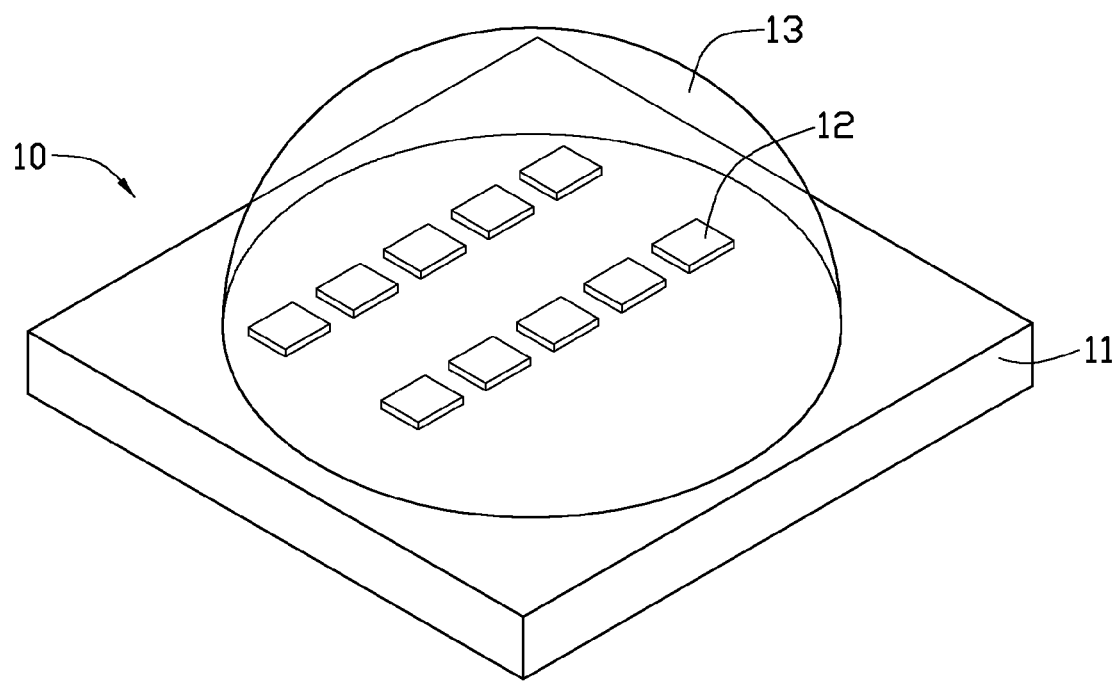
FIG. 1 is an assembled view of an LED module of a first embodiment of the present disclosure.

Referring to FIG. 1, an LED module 10 of a first embodiment of the present disclosure is shown. The LED module 10 includes a base 11, a plurality of LEDs 12 arranged on the base 11, and a package 13 arranged on the base 11 and encapsulating the LEDs 12 therein.

Figure 2:
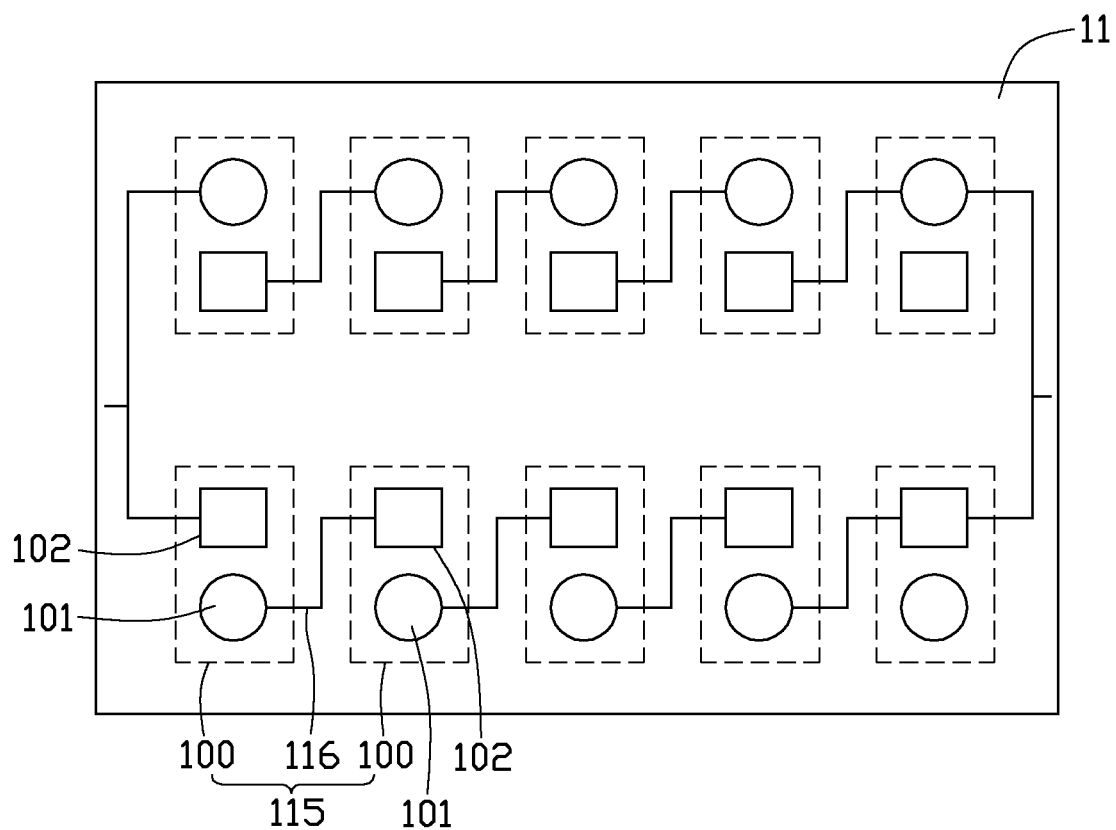
FIG. 2 is a top plan view of a base of the LED module of FIG. 1.

The base 11 is rectangular and electrically insulated. A top surface of the base 11 is coated with a layer of electrically conductive material to form a circuit layer 115 thereon, as shown in FIG. 2. The circuit layer 115 forms a plurality of spaced connecting sections 100. The connecting sections 100 are arranged in two rows. In each row, the connecting sections 100 are aligned with each other. Each connecting section 100 includes a first connecting part 101 and a second connecting part 102 spaced from and electrically insulated from each other. A gold wire 116 electrically connects the first connecting part 101 and the second connecting part 102 of two adjacent connecting sections 100. The gold wire 116 is formed on the top surface of the base 11. The LEDs 12 are respectively mounted on the connecting sections 100.

Figure 3:
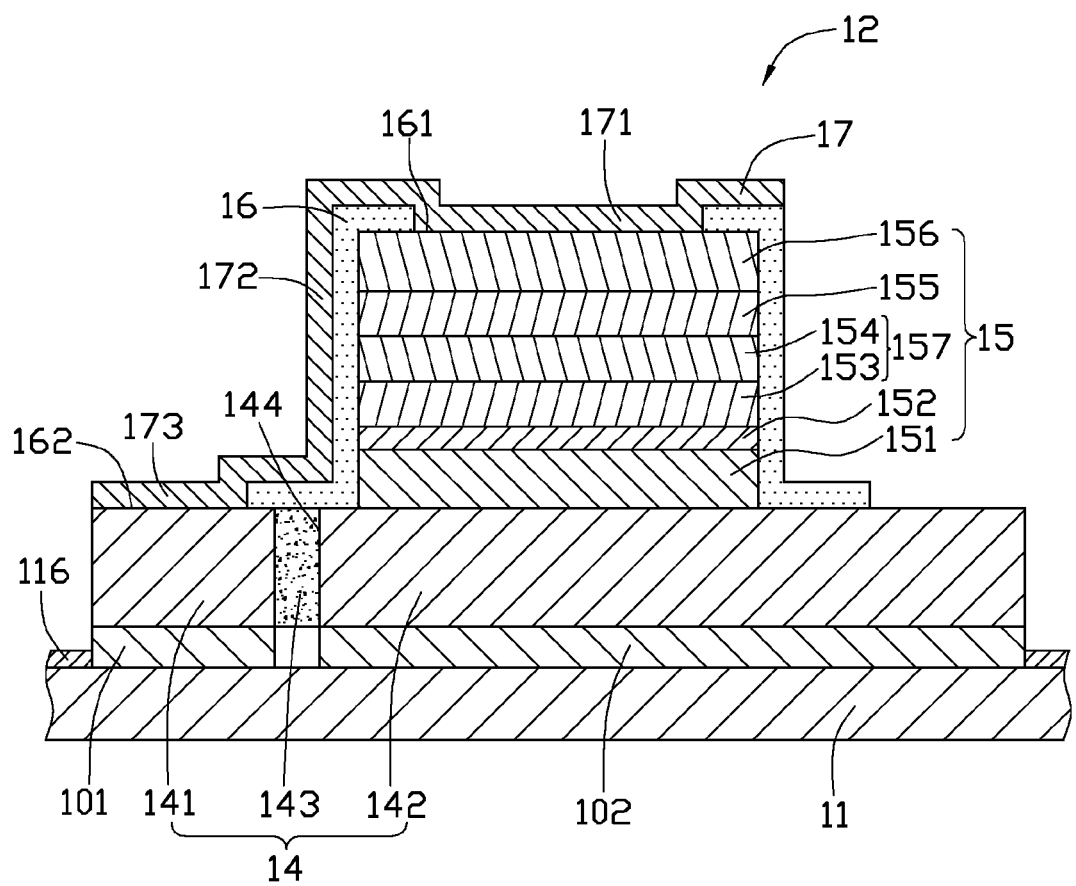
FIG. 3 is a broken-out section of one of the LEDs of the LED module of FIG. 1.

FIG. 3 shows one of the LEDs 12 mounted on a corresponding connecting section 100 of the base 11. The LED 12 includes an electrode layer 14, an LED die 15 formed on the electrode layer 14, an electrically insulating layer 16 surrounding the LED die 15 and a transparent electrically conductive layer 17 electrically connecting the LED die 15 and the electrode layer 14.

The electrode layer 14 covers the corresponding connecting section 100, and has a size substantially equal to the corresponding connecting section 100. A through slot 144 is defined in the electrode layer 14 and aligned with a gap between the first and second connecting parts 101, 102, thereby dividing the electronic layer 14 into two separate sections, i.e., a first section 141 and a second section 142. The first section 141 is located on and electrically connects the first connecting part 101, and the second section 142 is located on and electrically connects the second connecting part 102. An electrically insulating material 143 is filled in the through slot 144 to electrically insulate the first section 141 from the second section 142.

The LED die 15 includes an electrically conductive substrate 151, a metal reflective layer 152 formed on the substrate 151, a P-type III nitride semiconductor layer 157 formed on the metal reflective layer 152, an active layer 155 formed on the P-type III nitride semiconductor layer 157, and an N-type III nitride semiconductor layer 156 formed on the active layer 155. In this embodiment, the P-type III nitride semiconductor layer 157 includes a P-type gallium nitrogen layer 153 and a P-type gallium aluminum nitrogen layer 154. The N-type III nitride semiconductor layer 156 is an N-type gallium nitrogen layer. The substrate 151, the metal reflective layer 152, the P-type gallium nitrogen layer 153, the P-type gallium aluminum nitrogen layer 154, the active layer 155 and the N-type III nitride semiconductor layer 156 are stacked one on the other along a vertical direction of the LED module 10. Light emitted from the active layer 155 is reflected up by the metal reflective layer 152, thereby enhancing light emitting efficiency of the LED module 10. The substrate 151 is positioned on the second section 142 of the electrode layer 14 and electrically connected to the second section 142.

The electrically insulating layer 16 is transparent and made of silicon dioxide or silicon nitride. In this embodiment, the electrically insulating layer 16 totally covers lateral sides of the LED die 15, and covers a periphery of a top side of the LED die 15 with a through hole 161 defined above a central portion of a top of the N-type gallium nitrogen layer 156. The electrically insulating layer 16 also covers part of top surfaces of the first and second sections 141, 142 near the LED die 15. The electrically insulating layer 16 covers the through slot 144 of the electrode layer 14.

The transparent electrically conductive layer 17 electrically connects the N-type III nitride semiconductor layer 156 and the first section 141 of the electrode layer 14. The transparent electrically conductive layer 17 is made of transparent metal, indium tin oxide, or carbon nanotube film. The transparent electrically conductive layer 17 includes a first covering portion 171 covering the top side of the LED die 15, a second covering portion 173 covering the first section 141, and a connecting portion 172 interconnecting the first covering portion 171 and the second covering portion 173 and covering on a lateral side of a part of the electrically insulating layer 16.

The first covering portion 171 is filled in the through hole 161 to electrically connect the central portion of the N-type gallium nitrogen layer 156 of the LED die 15. The second covering portion 173 is arranged on the first section 141 and thus electrically connected to the first section 141. The electrically insulating layer 16 is located between the electrically conductive layer 17 and the LED die 15 to electrically insulate the electrically conductive layer 17 from the LED die 15 except the central portion of the top of the N-type gallium nitrogen layer 156.

Again referring to FIG. 1, the package 13 is made of transparent, electrically insulating materials, such as silicone, epoxy, quartz, or glass. The package 13 encapsulates the LEDs 12 therein and is formed on the base 11.

Figure 4:
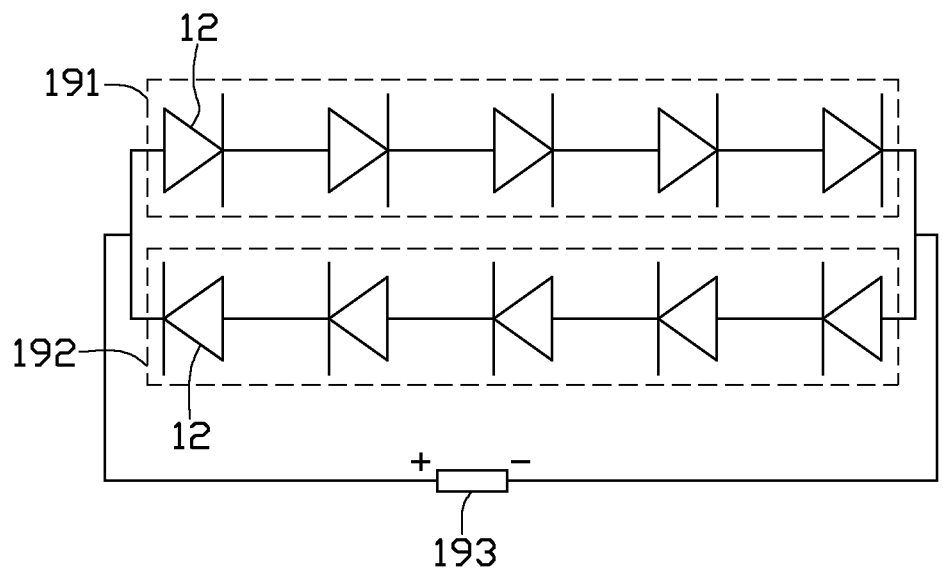
FIG. 4 is a circuit diagram of the LED module of FIG. 1.

Referring also to FIG. 4, the LEDs 12 are mounted on two rows of the connecting sections 100 to form a first LED group 191 and a second LED group 192. The LEDs 12 of the first LED group 191 or the second LED group 192 connect with each other in series. The LEDs 12 of the first LED group 191 connect with the LEDs 12 of the second LED group 192 in parallel. The first LED group 191 and the second LED group 192 electrically connect to an alternating current power source 193.

In the present disclosure, because the transparent electrically conductive layer 17 and the electrically insulating layer 16 are transparent, and coated on the LED die 15 directly, light emitted from the active layer 155 is able to transmit through the transparent electrically conductive layer 17 and the electrically insulating layer 16, and is not blocked or is blocked at a minor amount. Therefore, light emitting efficiency of the LED module 10 is improved in comparison with the conventional LED module.

Figure 5:
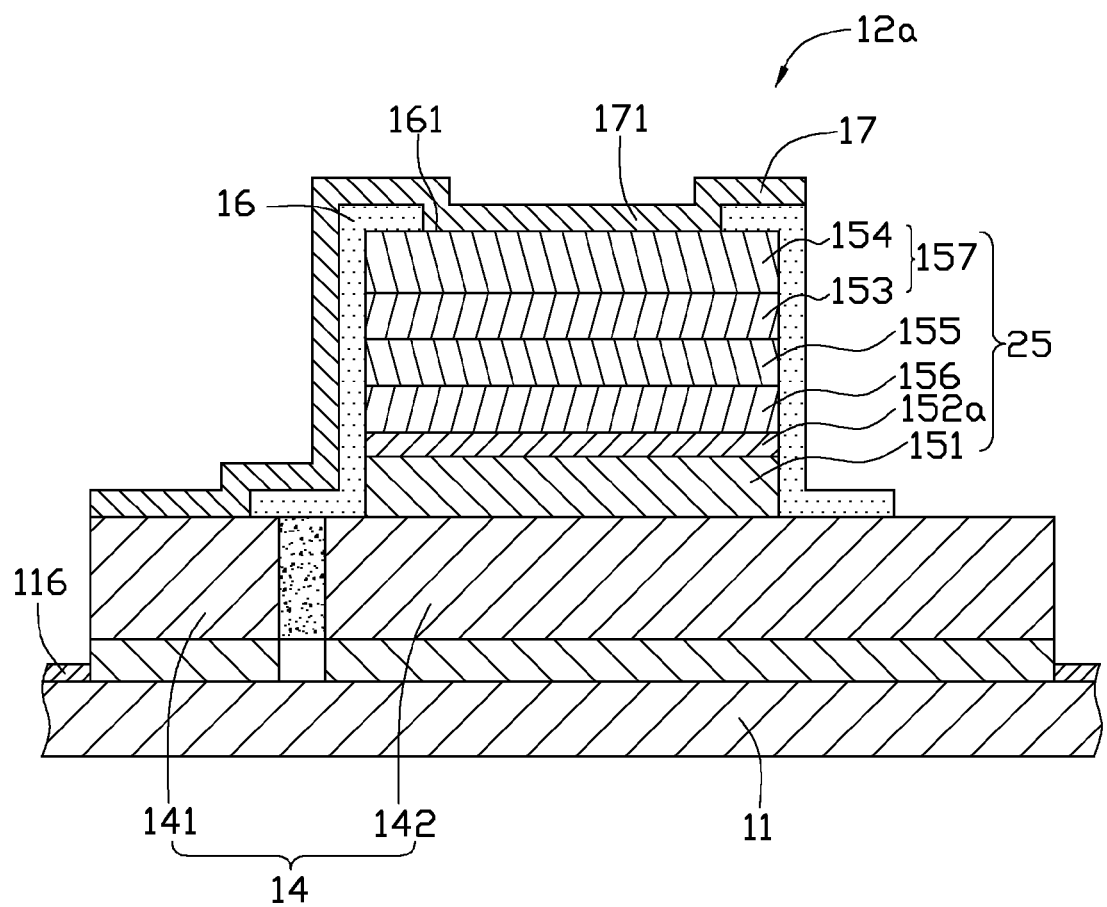
FIG. 5 is a broken-out section of one of LEDs of an LED module of a second embodiment of the present disclosure.

FIG. 5 shows one of LEDs 12a mounted on the base 11 of the second embodiment. The LED 12a is similar to the LED 12 of the first embodiment while the difference is the structure of the LED die 25. The LED die 25 includes the substrate 151 mounted on the second section 142 of the electrode layer 14, a bragg reflecting layer 152a formed on the substrate 151, the N-type III nitride semiconductor layer 156 formed on the bragg reflecting layer 152a, the active layer 155 formed on the III nitride semiconductor layer 156 and the P-type III nitride semiconductor layer 157 formed on the active layer 155. The P-type III nitride semiconductor layer 157 includes a P-type gallium nitrogen layer 153 and a P-type gallium aluminum nitrogen layer 154. The N-type III nitride semiconductor layer 156 may be a N-type gallium nitrogen layer. The first covering portion 171 is filled in the through hole 161 to connect the central portion of the P-type gallium aluminum nitrogen layer 154.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED module comprising:
   a base;
   a circuit layer formed on the base, the circuit layer comprising a plurality of spaced connecting sections, and each connecting section comprising a. first connecting part and a second connecting part electrically insulating and spaced from each other, gap defined between the first connecting part and the second connecting part to make the first connecting part and the second connecting part electrically insulating from each other, and
   a plurality of LEDs respectively mounted on the connecting sections, each LED comprising:
   an electrode layer a through slot defined in the electrode layer, and an electrically insulating material filled in the through slot to divide the electrode layer into a first section and a second section electrically insulated from the first section, the first and second section respectively electrically connecting the first and second connecting pads of a corresponding connecting section of the circuit layer, and the through slot communicating and aligning with the gap between the first connecting part and the second connecting part;
   an LED die arranged on the second section of the electrode layer and electrically connected to the second section;
   a transparent electrically conductive layer formed on the LED die and electrically connecting the LED die to the first section of the electrode layer; and
   an electrically insulating layer surrounding the LED die except where the transparent electrically conductive layer connecting to and located between the LED die and the transparent electrically conductive layer.

2. The LED module of claim 1, wherein a gold wire electrically connects the first connecting part and the second connecting part of two adjacent connecting sections.

3. The LED module of claim 2, wherein the LEDs are arranged in two rows to form a first LED group and a second LED group, the LEDs of the first LED group or the second LED group connect with each other in series, and LEDs of the first LED group connect with the LEDs of the second LED group in parallel.

4. The LED module of claim 3, wherein the first LED group and the second LED group electrically connect to an alternating current power source.

5. The LED module of claim 1, wherein package encapsulates LEDs therein and is formed on the base.

6. The module of claim 1, wherein the electrically insulating layer comprises a through hole defined above the LED die, the electrically insulating layer completely covers lateral sides of the LED die and a periphery of the through hole, and the transparent electrically conductive layer is filled in the through hole to electrically connect with the LED die.

7. The LED module of claim 6, wherein the electrically insulating layer partially covers the first section of the electrode layer, the first section comprises an exposed portion, and the exposed portion of the first section is electrically connected with the transparent electrically conductive layer.

8. The LED module of claim 7, wherein the transparent electrically conductive layer comprises a first covering portion, a second covering portion, and a connecting portion interconnecting the first covering portion and the second covering portion, and wherein the first covering portion is filled in the through hole and electrically connected with the LED die, and the second covering portion contacts the exposed portion of the first section of the electrode layer.

9. The LED module of claim 1, wherein the electrically insulating layer is transparent.

10. The LED module of claim 1, wherein the LED the comprises an electrically conductive substrate formed on the second section of the electrode layer, a bragg reflecting layer formed on the substrate, an N-type III nitride semiconductor layer formed on the bragg reflecting layer, an active layer formed on the N-type III nitride semiconductor layer, and a P-type III nitride semiconductor layer formed on the active layer, and the P-type III nitride semiconductor layer electrically contacts the transparent electrically conductive layer.

11. The LED module of claim 10, wherein the bragg reflecting layer, the N-type III nitride semiconductor layer, the active layer, and the P-type III nitride semiconductor layer are stacked one on the other.

12. The LED module of claim 11, wherein the P-type III nitride semiconductor layer includes a P-type gallium nitrogen layer and a P-type gallium aluminum nitrogen layer.

13. The LED module of claim 11, wherein the N-type III nitride semiconductor layer is an N-type gallium nitrogen layer.

14. The LED module of claim 1, wherein the LED die comprises an electrically conductive substrate formed on the second section of the electrode layer, a metal reflective layer formed on the substrate, a P-type III nitride semiconductor layer formed on the metal reflective layer, an active layer formed on the P-type III nitride semiconductor layer, and an N-type III nitride semiconductor layer formed on the active layer, and the N-type III nitride semiconductor layer electrically contacts the transparent electrically conductive layer.

15. The LED module of claim 14, wherein the metal reflective layer, the P-type III nitride semiconductor layer, the active layer, and the N-type III nitride semiconductor layer are stacked cite on the other.

16. The LED module or claim 14, wherein the P-type III nitride semiconductor layer includes a P-type gallium nitrogen layer and a P-type gallium aluminum nitrogen layer.

17. The LED module of claim 14, wherein the N-type III nitride semiconductor layer is an N-type gallium nitrogen layer.

* * * * *